(12) United States Patent
Bucossi et al.

(10) Patent No.: US 10,075,174 B1
(45) Date of Patent: Sep. 11, 2018

(54) PHASE ROTATOR APPARATUS

(71) Applicant: GLOBALFOUNDRIES Inc., Grand Cayman (KY)

(72) Inventors: William L. Bucossi, Waterbury, VT (US); Hayden C. Cranford, Jr., Cary, NC (US); Vivek K. Sharma, Olten (CH); Fengqi Zhang, New York, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/629,900

(22) Filed: Jun. 22, 2017

(51) Int. Cl.
| | |
|---|---|
| *H03K 5/13* | (2014.01) |
| *H03L 7/099* | (2006.01) |
| *H03L 7/07* | (2006.01) |
| *H03H 11/20* | (2006.01) |

(52) U.S. Cl.
CPC .............. *H03L 7/0998* (2013.01); *H03L 7/07* (2013.01); *H03H 11/20* (2013.01)

(58) Field of Classification Search
CPC .......... H03L 7/07; H03L 7/0998; H03H 11/20
See application file for complete search history.

(56) References Cited

U.S. PATENT DOCUMENTS

| | | | | |
|---|---|---|---|---|
| 6,249,187 B1 * | 6/2001 | Chou | .................... | H03F 1/22 330/267 |
| 7,053,712 B2 | 5/2006 | Bonaccio et al. | | |
| 7,560,967 B2 | 7/2009 | Freyman et al. | | |
| 7,961,025 B2 | 6/2011 | Rylov | | |
| 9,407,206 B2 | 9/2016 | Lin et al. | | |
| 9,559,706 B1 * | 1/2017 | King | ..................... | H03K 5/13 |
| 2003/0123589 A1 * | 7/2003 | Glenn | ................ | H03L 7/0812 375/354 |
| 2003/0123594 A1 * | 7/2003 | Glenn | ................ | H03L 7/0814 375/373 |
| 2006/0055430 A1 * | 3/2006 | Pickering | ............. | H03K 5/13 327/2 |
| 2006/0250722 A1 * | 11/2006 | Carpenter | ........ | G11B 20/10009 360/48 |
| 2008/0164917 A1 | 7/2008 | Floyd et al. | | |

(Continued)

OTHER PUBLICATIONS

Sidiropoulos, A Semidigital Dual Delay-Locked Loop, Journal, Nov. 1997, 1689-1692, vol. 32 No. 11, IEEE Journal of Solid-State Circuits.

(Continued)

*Primary Examiner* — Syed Haider
(74) *Attorney, Agent, or Firm* — David Cain; Hoffman Warnick LLC

(57) ABSTRACT

A phase rotator apparatus has phase interpolation and transimpedance amplifier (TIA) stages. This separates gain and bandwidth as degrees of design freedom, facilitating a reduction in power consumption while enabling the data link to transmit and receive higher speed data. Four phases of an incoming signal are combined by the phase interpolation stage using weighting currents and current-source loads to produce a phase shifted current based signal that the TIA stage receives as input. The TIA stage then converts the signal to a voltage based signal. The quiescent operating voltage of the stage outputs can be maintained with common mode feedback circuits and injector currents.

20 Claims, 4 Drawing Sheets

(56) References Cited

U.S. PATENT DOCUMENTS

2010/0109734 A1* 5/2010 Rylov .................. H03H 11/20
                                                    327/256
2010/0329403 A1   12/2010 Beukema et al.
2016/0112016 A1*  4/2016 Lakshmikumar ......... H03F 3/08
                                                    330/260

OTHER PUBLICATIONS

Kreienkamp et al, A 10-GB/s CMOS Clock and Data Recovery Circuit with an Analog Phase Interpolator, Symposium, 2003, 73-76, IEEE 2003 Custom Integrated Circuits Conference
Gangasani et al, A 16-GB/s Backplane Transceiver with 12-Tap Current Integrating DFE and Dynamic Adaptation of Voltage Offset and Timing Drifts in 45-nm SOI CMOS Technology, Journal, Aug. 2012, 1828-1841, IEEE Journal of Solid-State Circuits.
Kimura et al. 28 GB/s 560mW Multi-Standard SerDes with Single-Stage Analog Front-End and 14-Tap Decision-Feedback Equalizer in 28 nm CMOS, Symposium, Feb. 10, 2014, 38-40, IEEE International of Solid-State Circuits Conference.
Bulzacchelli et al, A 10-Gb/s 5-Tap DFE/4-Tap FFE transceiver in 90-nm CMOS Technology, Journal, Dec. 2006, 2885-2899, vol. 41, No. 12, IEEE Journal of Solid-State Circuits.
Search Report and Written Opinion and English Translation thereof for corresponding Taiwanese Patent Application No. 107100641 dated Jun. 2, 2018, 12 pages.

* cited by examiner

PHASE ROTATOR APPARATUS

BACKGROUND

The present disclosure relates to a circuit for control of phases of clock signals, and more specifically, to a phase rotator that allows for operation at high frequencies and power savings at lower frequencies.

Phase rotators are important parts of clock subsystems in data processing and communications systems. The predominant architecture for phase rotators use current-mode logic (CML) structures with quadrature clock sets of I, Q in which phases 0° (called +I, I, or $I_+$), 90° or $$\frac{\pi}{2}$$

radians (called +Q, Q, or $Q_+$), 180° or π radians (called −I, $\bar{I}$, or $I_-$), and 270° or $$\frac{3\pi}{2}$$

radians (called −Q, $\bar{Q}$, or $Q_-$). Weighting currents are applied to the four phases to produce a phase shifted signal, initially as a differential output current. Load resistors/impedances are connected to each part of the differential output current to convert the output to a differential output voltage. This architecture has the advantage of relative simplicity, but as speeds increase, CML-based phase rotators have ever-higher power demands-producing ever-lower efficiencies. While various strategies can be employed to increase usable data rates while mitigating power consumption, alternatives to CML-based phase rotators with higher efficiency and lower power requirements are desirable for use with emerging high-frequency clock data recovery (CDR) systems.

SUMMARY

A first aspect of the present disclosure provides a phase rotator system having a phase interpolation stage including at least two gain ($G_m$) stages connected in parallel to a differential output of the phase interpolation stage. Each gain stage can receive as input a respective pair of phases of an incoming clock signal, and a current-output digital-to-analog converter (DAC) apparatus can supply at least one tail current to each phase interpolation stage. Each current supplied by the current-output DAC can act as a weight on the respective pair of phases. The phase rotator system can also include a transimpedance amplifier (TIA) stage having a differential TIA stage input connected to the differential output of the phase interpolation stage and a TIA stage output. A channel can be connected to the TIA stage output and selectively deliver the TIA stage output as an output of the phase rotator system representing a phase-adjusted version of the incoming clock signal.

A second aspect of the present disclosure provides a phase rotator apparatus in which a four-quadrant phase interpolation stage includes a differential current-mode mixer. At least four differential input devices can be connected in parallel in the mixer and can be disposed to mix respective equidistant phases of an incoming clock signal. A differential output of the phase interpolation stage can include a positive output part and a negative output part, the differential output of the phase interpolation stage representing an initial adjusted clock signal. A respective current-source load can be connected to each respective part of the output of the phase interpolation stage. Weight signals can be provided to the differential input devices as tail currents of the differential input devices by a plurality of current-output digital-to-analog converters that selectively generate at least two pairs of output currents. The system can also include a transimpedance amplifier (TIA) stage with a differential input connected to the differential output of the phase interpolation stage and having a TIA stage output. At least one output channel can be connected to the TIA stage output for delivering the output from the TIA stage as an output of the phase rotator apparatus representing a phase-adjusted version of the incoming clock signal.

A third aspect of embodiments disclosed herein includes a phase rotator apparatus in which at least two sets of differential voltage inputs each having a positive part and a negative part can be received by a phase interpolation stage. The phase interpolation stage can have a differential output and a differential current-mode mixer, the mixer including at least two pairs of differential input transistors, each transistor having a respective source, gate, and drain. Each pair of the at least two pairs of differential input transistors can have a respective input in electrical communication with one of the two sets of differential voltage inputs, one pair of the at least two pairs of differential input transistors being associated with a minimum phase of the phase rotator and another pair of the at least two pairs of differential input transistors being associated with a different phase of the phase rotator. The drains of the differential input transistors associated with the respective positive part of each differential voltage input can be connected to each other and to the negative part of the differential output of the phase interpolation stage, and the drains of the differential input transistors associated with the respective negative part of each differential voltage input are connected to each other and to the positive part of the differential output of the phase interpolation stage. The system can also include a first current-source load connected to the negative part of the differential output of the current-mode mixer, as well as a second current-source load connected to the positive part of the differential output of the current-mode mixer. A current-output digital-to-analog converter (DAC) apparatus can be in electrical communication with the sources of the differential input transistors selectively generating output currents, thereby providing weight signals as tail currents to the at least two pairs of differential input transistors. The system can further include a transimpedance amplifier (TIA) stage connected to and receiving as input the differential output of the phase interpolation stage and having a TIA stage output with which at least one output channel can be in electrical communication for delivering the output from the TIA stage as an output of the phase rotator apparatus.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and which show by way of illustration specific embodiments that are examples of how the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

As used herein, "differential pair", also called a source-coupled pair, means a pair of transistors with sources connected to a common weighting current source and gates connected to two input signals, and the drains of these transistors providing a path for current flow from the load impedances of the differential pair of transistors.

A "differential input device" can refer to a differential pair of transistors, but can refer to other differential input arrangements as are known in the art, and as used herein means a device that amplifies the difference between two input signals by some factor such that a circuit acts in proportion to said difference, while ignoring any values common to both signals.

Phase rotators can modify the phase of a signal by an amount $\phi$ using the identity $$\sin(2\pi ft + \phi) = A_1 \sin(2\pi ft) + A_2 \sin\left(2\pi ft + \frac{\pi}{2}\right) \quad (1)$$

using appropriate values of parameters $A_1$ and $A_2$. However, phase rotators use approximations of sinusoidal waves, and so Eq. (1) will be modified in accordance with the type of approximation employed.

Figure 1:
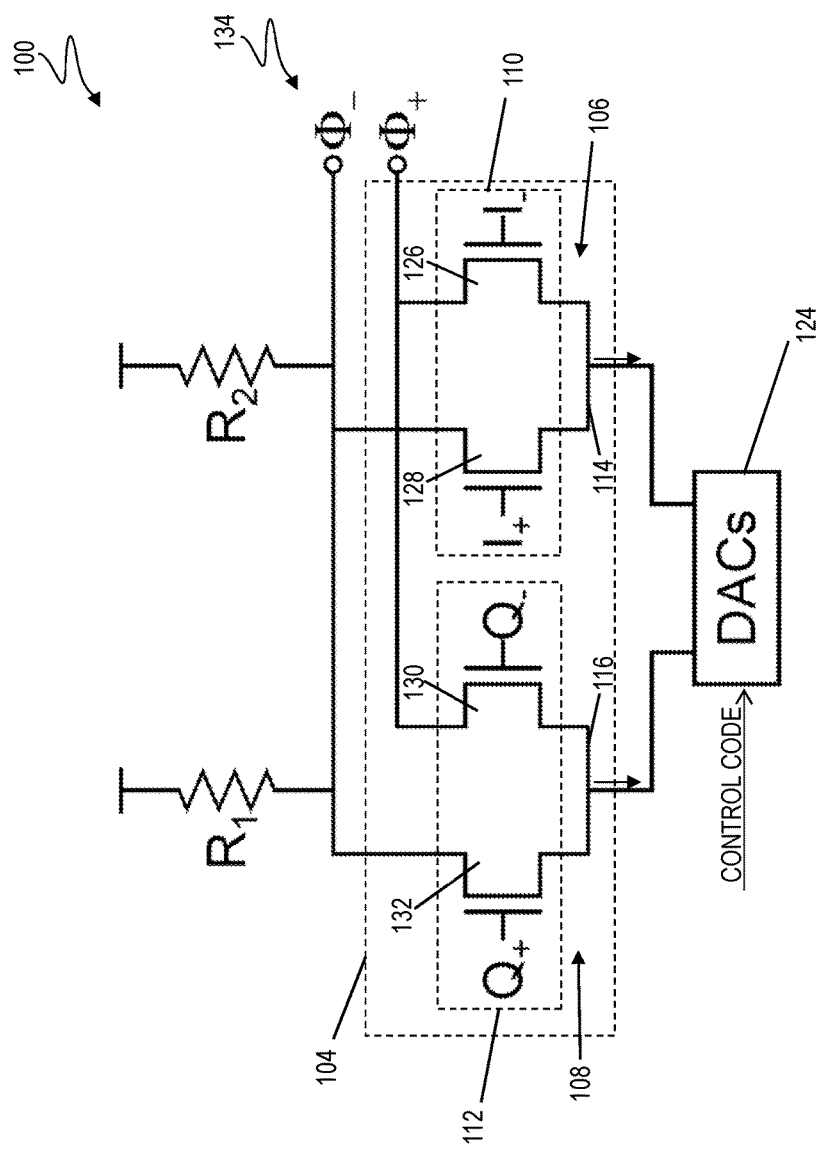
FIG. 1 is a schematic block diagram of a conventional current-mode logic (CML) phase rotator.

FIG. 1 shows an example of a conventional CML phase rotator 100. As shown, phase rotator 100 receives two differential phase inputs using a quadrature clock set of I, Q including phases 0° (called +I, I, or $I_+$), 90° (called +Q, Q, or $Q_+$), 180° (called −I, $\bar{I}$, or $I_-$), and 270° (called −Q, $\bar{Q}$, or $Q_-$). While the clock set shown includes four equidistant phases, it should be recognized that other sets could be used with other numbers of differential phase inputs, phases, and/or other distances between phases within the scope of embodiments. CML phase rotator 100 includes a first part in the form of a differential current-mode mixer 104 that receives the two differential phases $I=(I_+, I_-)$ and $Q=(Q_+, Q_-)$ as input, such as two differential inputs 106, 108 to two differential input devices 110, 112 driven by variable weighting currents 114, 116. The weighting currents 114, 116 are generated by a second part with a current-mode digital to analog converter (DAC) apparatus 124 that includes one or more current-mode DACs.

In an ideal case, DACs 124 would generate weighting currents that would be sinusoidal functions of the desired phase shift $\phi$, so that the weights $\cos \phi$ and $\sin \phi$ would be applied to differential phases $I=(I_+, I_-)$ and $Q=(Q_+, Q_-)$. However, the closer the DAC comes to the ideal, the more complex the circuitry, and thus the more area the DAC occupies. As a compromise, phase rotators typically employ approximations of the sinusoidal functions with discrete increments in weighting currents applied across the differential phases in various manners.

Two basic approaches to CML phase rotator architecture are commonly used. A first architecture uses one DAC with two outputs and two polarity switches, which can approximate a sine wave with a triangular wave. This is the type shown in FIG. 1, the polarity switch details omitted for convenience since such systems are well understood by those skilled in the art. See, for example, U.S. Pat. No. 7,961,025 to Rylov et al., the disclosure of which is hereby incorporated in its entirety by reference. A second type uses two DACs, each with two outputs, and without polarity switches, which can approximate a sine wave with a trapezoidal wave, but is twice as complex as the first. Thus, the first type is typically preferred since it will occupy much less circuit area, while the second type can be used where better approximations of the sinusoidal function are desired.

For a CML phase rotator, in one common way to achieve phase interpolation, by way of non-limiting example, each non-negative tail current from the DAC(s) represents a weight $D_n$ to be applied to the respective clock phases. Implementing a phase shift of an arbitrary $\phi$ can be achieved with weights $D_1$, $D_2$, $D_3$, and $D_4$, working from Eq. (1), according to:

$$\sin(2\pi ft + \phi) = D_1 \sin(2\pi ft) + \quad (2)$$
$$D_2 \sin\left(2\pi ft + \frac{\pi}{2}\right) + D_3 \sin(2\pi ft + \pi) + D_4 \sin\left(2\pi ft + \frac{3\pi}{2}\right),$$

where $D_1=\max(A_1,0)$, $D_2=\max(A_2,0)$, $D_3=-\min(A_1,0)$, $D_4=-\min(A_2,0)$, $A_1=D_1-D_3$, and $A_2=D_2-D_4$. It should be recognized that phase interpolation can be done in other ways, and the example provided here is not unique to CML phase rotators/interpolators; the example should not be regarded as limiting the scope of embodiments, but is provided solely for the purpose of description thereof.

Returning to the typical CML phase rotator 100 shown in FIG. 1, differential input devices 110, 112 each include a pair of transistors. Thus, differential input device 110 includes first and second transistors 126, 128, while differential input device 112 includes third and fourth transistors 130, 132. Gates of the transistors 126-132 each receive one of the phases of the incoming clock signal, while their sources receive the weighting currents and their drains are connected to a differential output 134 of differential current-mode mixer 104. Differential output 134 includes a positive part $\Phi_+$ and a negative part $\Phi_-$. In the example shown in FIG. 1, first transistor 126 receives the zero phase $I_+$, second transistor 128 receives the $\pi$ phase $I_-$, third transistor 130 receives the $$\frac{\pi}{2}$$

phase $Q_+$, and fourth transistor 132 receives the phase $Q_-$. Drains of first transistor 126 and third transistor 130 are connected to positive part $\Phi_+$ of differential output 134, while drains of second transistor 128 and fourth transistor 132 are connected to negative part $\Phi_-$ of differential output 134. In embodiments, differential output 134 is a differential voltage output; load resistors $R_1$, $R_2$ can be connected to negative part $\Phi_-$ and positive part $\Phi_+$ of differential output 134, respectively, though impedances could be used instead where suitable. The voltage on positive part $\Phi_+$ of differential output 134 thus is a voltage clock signal representing the phase-shifted incoming clock signal, while the voltage on negative part $\Phi_-$ of differential output 134 represents the opposite polarity. As stated above, typical current-day CML phase rotators such as that shown in FIG. 1 suffer from reduced efficiency and bandwidth limitations at higher speeds, which can render their output signals unusable.

An unexpected synergy has been found when a current-output CML phase rotator is combined with an amplifier, particularly, for example, a transimpedance amplifier (TIA) according to embodiments disclosed herein. More specifically, a phase rotator apparatus using one or more gain stages in a phase interpolation stage, replacing the typical load resistors/impedances with current-source loads, and feeding output of the phase interpolation stage to an amplification stage, such as a TIA stage, can achieve reliable phase rotation at much higher clock speeds with lower than expected power demands and/or higher than expected power efficiency than would be predicted based on the relative complexity of the phase rotator apparatus of embodiments. In addition, using gain and TIA stages in this manner adds new degrees of design freedom in the phase rotator apparatus, allowing finer control of parameters such as phase rotation, gain, and bandwidth for a given level of power consumption than can be accomplished with typical phase rotators. Thus, a phase rotator apparatus according to embodiments disclosed herein has particular utility in that it can work with higher clock speeds than today's typical phase rotators can handle, yet does so with higher resolution and with lower than expected power demand.

Figure 2:
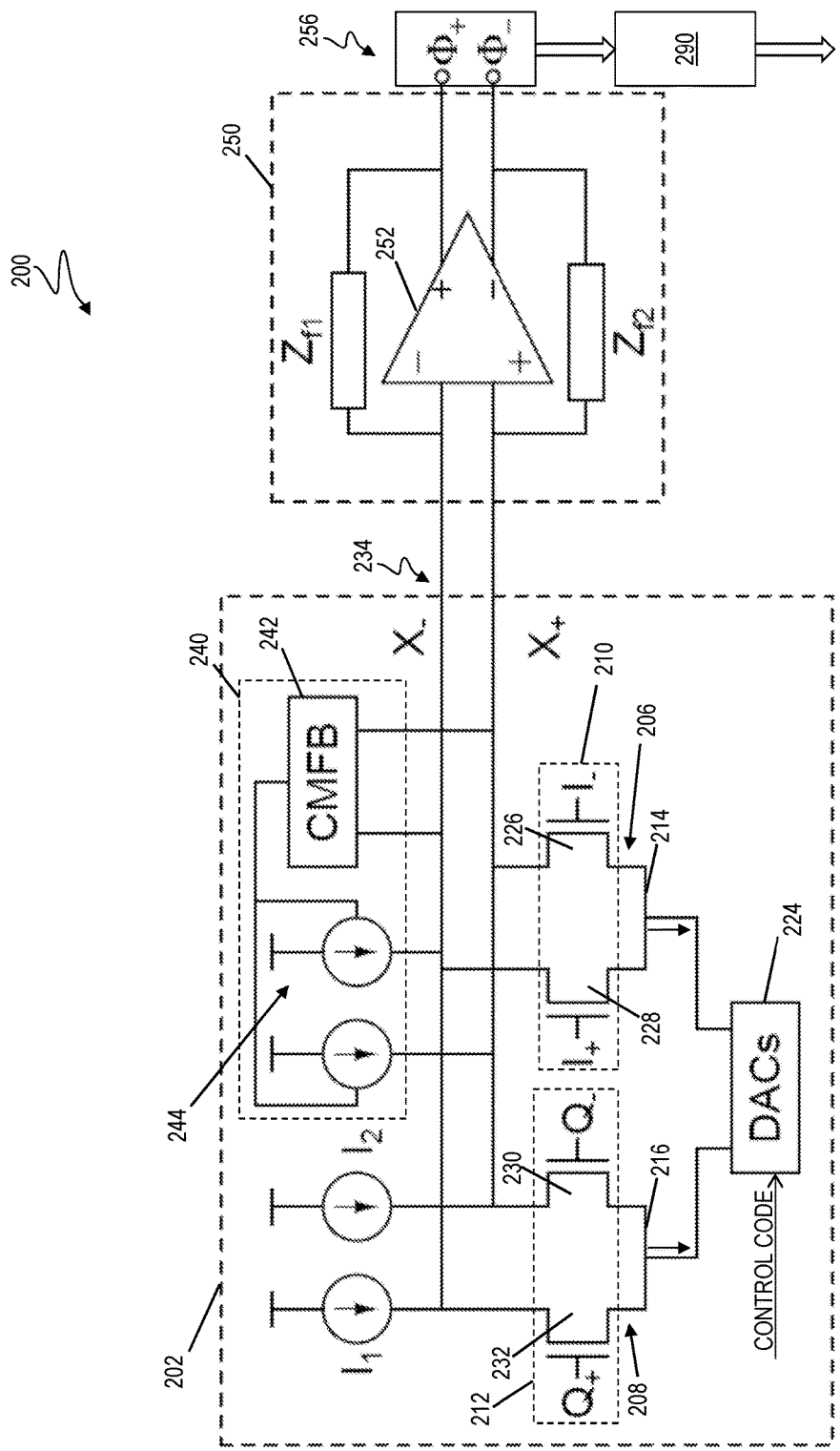
FIG. 2 is a schematic circuit diagram showing an example of a phase rotator apparatus implemented in accordance with embodiments disclosed herein.

To provide a reliable and more efficient phase rotator apparatus at high clock speeds, embodiments disclosed herein combine a variant of a CML phase rotator with an amplifier, such as a transimpedance amplifier (TIA). For example, FIG. 2 schematically illustrates a non-limiting example of a phase rotator apparatus 200 according to embodiments disclosed herein that can include a phase interpolation stage 202 and a TIA stage 250. Phase interpolation stage 202 can receive a set of a number N of phases, such as the non-limiting example of four equidistant differential phases $I_+$, $Q_+$, $I_-$, $Q_-$ described above, of an incoming clock signal, replacing the typical load resistors with current-source loads $I_1$, $I_2$ and producing output currents $X_+$, $X_-$. Thus, phase interpolation stage 202 can have a differential output 234 having a positive part $X_+$ that is a current representing the phase-shifted incoming clock signal and a negative part $X_-$ that is a current representing the inverse of the phased shifted incoming clock signal. In other words, phase interpolation on the N input phases, here the four phases $I_+$, $Q_+$, $I_-$, $Q_-$, by phase interpolation stage 202 produces an output current signal, differential output 234, that includes positive part $X_+$ and negative part $X_-$. In applications in which additional amplification is needed or desired, multiple TIA stages can be used, where a device or arrangement can be included between TIA stages to convert the output of one TIA stage from a voltage signal to a current signal that is the input for the next TIA stage. For example, TIA stage 250 can be a first of at least two TIA stages arranged in series, with provision for converting the voltage output of the TIA stage to a current output, such as by including an interposed transconductance stage, a source coupled differential pair stage, or other suitable device or arrangement as would be evident to those skilled in the art. In some implementations, one or more current-to-voltage converters could take the form of additional phase interpolation stages 202 within the scope of embodiments.

TIA stage 250 acts as a current-to-voltage converter, typically constructed using a voltage gain element and a feedback impedance. The voltage at the input of the TIA can be independent of the input current. TIA stage 250 can include an amplifier 252 receiving as input differential output 234 of phase interpolation stage 202 and having a differential TIA stage output 254 including positive part $\Phi_+$ and negative part $\Phi_-$. TIA stage 252 can also include at least one impedance $Z_{f1}$ connected to negative part $X_-$ of differential output 234 and to a positive part $\Phi_+$ of TIA stage output 254, as well as at least one impedance $Z_{f2}$ connected to positive part $X_+$ of differential output 234 and to a negative part $\Phi_-$ of TIA stage output 254. Thus, amplifier 252, impedance(s) $Z_{f1}$, and impedance(s) $Z_{f2}$ are connected in a typical, non-limiting example of a differential feedback network.

More specifically, the non-limiting example of a phase rotator apparatus 200 can include a number N of sets of differential voltage inputs or input phases, each having a positive part and a negative part, and producing a differential output voltage 256 including positive and negative parts $\Phi+$, $\Phi-$. In the example shown, phase rotator apparatus can have two sets of differential voltage inputs 206, 208, here representing four phases $I+$, $I-$, $Q+$, $Q-$ of an incoming signal as described above. A phase interpolation stage 202, continuing with the non-limiting example, can receive the two sets of differential voltage inputs and can have a differential output 234 including output currents $X+$, $X-$. Phase interpolation stage 202 can be viewed as including a differential current-mode mixer that can produce differential output 234 of phase interpolation stage 202 having a positive part $X+$ and a negative part $X-$. At least two differential input devices 210, 212, such as at least two pairs of differential input transistors 226, 228, 230, 232, can be included in phase interpolation stage 202, each transistor having a respective source, gate, and drain. Each pair of the at least two pairs of differential input transistors can have a respective input in electrical communication with one of the two sets of differential voltage inputs, with one pair of the at least two pairs of differential input transistors being associated with a minimum phase of the phase rotator and another pair of the at least two pairs of differential input transistors is associated with a different phase of the phase rotator.

As shown in the non-limiting example of FIG. 2, drains of the differential input transistors associated with the respective positive part of each differential voltage input, and thus drains of first transistor 226 and third transistor 230, are connected to each other and to negative part $X_-$ of the differential output 234 of phase interpolation stage 202. Similarly, drains of the differential input transistors associated with the respective negative part of each differential voltage input, here second transistor 228 and fourth transistor 232, are connected to each other and to positive part $X_+$ of differential output 234 of phase interpolation stage 202. A first current-source load $I_1$ can be connected to negative part $X_-$ of differential output 234 of phase interpolation stage 202, and a second current-source load $I_2$ can be connected to positive part $X_+$ of the differential output 234 of phase interpolation stage 202. Phase interpolation stage 202 can include a voltage control apparatus 240 including a common-mode feedback (CMFB) circuit 242 and injector current-source loads 244 connected to the differential output of current-mode mixer 204, thereby maintaining a voltage of differential output 234 of phase interpolation stage 202 at a desired level, which can include in embodiments a pre-defined level. As should be recognized by those skilled in the art, the operating (or common-mode) voltage of differential output 234 may be fixed, but could be actively driven to a time-varying interval, such as, for example, changed over a period of milliseconds or any other suitable interval(s) to accommodate changing supply voltage or another suitable parameter, or could be fixed as a result of circuit design. In embodiments including a pre-defined level, the particular pre-defined level for the common mode voltage can vary widely and should be chosen to optimize analog performance of the phase interpolation stage 202.

As seen in FIG. 2, a current-output digital-to-analog converter (DAC) apparatus 224 can supply at least one tail current to phase interpolation stage 202, such as to each differential pair 210, 212, each current acting as a weight on the respective pair of phases or each differential input phase. Thus, current-output DAC apparatus 224 can be in electrical communication with sources of differential input transistors 226-232 and can selectively generate output currents 214, 216, thereby providing weight signals as tail currents 214, 216 to the at least two pairs 210, 212 of differential input transistors 226-232. DAC apparatus 224 can include one or more DACs with various numbers of cells as may be suitable and/or desired, and in embodiments could include at least one DAC having polarity bits as part of control of currents 214, 216. See, for example, Rylov et al., incorporated by reference above. With suitable control code, current-output DAC apparatus 224 can selectively produce tail currents 214, 216 that position phase states of phase rotator apparatus output 234 on an octagonal envelope.

As also seen in FIG. 2, transimpedance amplifier (TIA) stage 250 of phase rotator apparatus 200 can include a differential TIA stage input in electrical communication with differential output 234 of differential current-mode mixer 204 and phase interpolation stage 202, the differential TIA stage input stage thus having a positive part and a negative part, here currents $X_+$, $X_-$. A TIA stage amplifier 252 can have a TIA stage amplifier input in electrical communication with each of positive part $X_+$ and the negative part $X_-$ of the differential TIA stage input, the TIA stage amplifier also having at least one TIA stage amplifier output in electrical communication with and/or that is a TIA stage output 256 including positive part $\Phi_+$ and negative part $\Phi_-$. At least one impedance-like load $Z_{f1}$ can be in electrical communication with negative part $X_-$ of the differential TIA stage input, and positive part $\Phi_+$ of TIA stage amplifier output/TIA stage output 256. Similarly, at least one impedance-like load $Z_{f2}$ can be in electrical communication with positive part $X_+$ of the differential TIA stage input, and negative part $\Phi_-$ of TIA stage amplifier output/TIA stage output 256. Phase rotator apparatus 200 can further include at least one output channel 290 in electrical communication with TIA stage output 256 for delivering the output from TIA stage 250 as an output of phase rotator apparatus 200.

TIA stage 250 can be fully differential and TIA stage amplifier 252 can include at least one pair of differential input transistors, each transistor having a respective source, gate, and drain, each pair of the at least one pair of differential input transistors having a respective input in electrical communication with one respective TIA stage amplifier input. TIA stage amplifier 252 can further include a common-mode feedback (CMFB) circuit connected to outputs of the at least one pair of differential transistors of TIA stage amplifier 252, as well as to the TIA stage output, thereby maintaining the TIA stage output at a desired level, which can include in embodiments a pre-defined level. As should be recognized by those skilled in the art, the operating (or common-mode) voltage of differential output 234 may be fixed, but could be actively driven to a time-varying interval, such as, for example, changed over a period of milliseconds or any other suitable interval(s) to accommodate changing supply voltage or another suitable parameter, or could be fixed as a result of circuit design. In embodiments including a pre-defined level, the particular pre-defined level for the common mode voltage can vary widely and should be chosen to optimize analog performance of the phase interpolation stage 202. In embodiments, TIA stage 250 can include at least one active pull-up input driving device and at least one active pull-down input driving device. Such arrangements mentioned above of TIA stage 250 will be described below in conjunction with the example of FIG. 3. In embodiments, a TIA 250 common mode can be controlled to a voltage that maximizes a large signal gain at a given clock frequency. If common mode is made too high, the rising edge rate degrades as the input drive, such as a PMOS input drive, approaches subthreshold operation. If common mode is made too low, this can reduce the tail current source drain to source voltage ratio, and at some point reduces tail current.

It can also be advantageous in embodiments to include at least one programmable current source $I_3$ in electrical communication with TIA stage amplifier 252 to adjust a bandwidth of the TIA stage, as will be seen below with regard to FIG. 3, though it should be noted that where CMFB is used in both phase interpolation stage 202 and TIA stage 250, the CMFB circuits can work in conjunction with frequency scaled tail current(s), such as currents 214, 216, so that frequency-dependent programmability in the pull-up current sources may not be necessary. Similarly, it can be advantageous to have the unit DAC current-programmable to adjust the bandwidth of phase interpolation stage 202, recognizing that such a design should include a CMFB circuit that can tolerate frequency scaling in DAC current. In the examples above, first and second current source loads $I_1$, $I_2$ are not shown as variable, relying on the use of a CMFB control system with wide enough range that they need not be varied. However, in implementations where such a range is not desirable or practical in a CMFB control system, one or both of first and second current source loads $I_1$, $I_2$ can be variable.

Phase interpolation stage 202 can be viewed as including at least two gain ($G_m$) stages connected in parallel to differential output 234 of phase interpolation stage 202, each gain stage $G_m$ receiving as input a respective pair of phases of an incoming clock signal. Each gain stage $G_m$ can be regarded as including at least a pair of differential input transistors, such as differential input devices 210, 212, and a CMFB circuit 242 connected to outputs of the differential input transistors and to differential output 234 of phase interpolation stage 202. CMFB 242 can thus maintain a common mode of phase interpolation stage at a desired level, such as at a design level and/or within a desired range of voltage, which can include in embodiments a pre-defined level. As should be recognized by those skilled in the art, the operating (or common-mode) voltage of differential output 234 may be fixed, but could be actively driven to a time-varying interval, such as, for example, changed over a period of milliseconds or any other suitable interval to accommodate changing supply voltage or another suitable parameter, or could be fixed as a result of circuit design. In embodiments with a pre-defined level, the particular pre-defined level for the common mode voltage can vary widely and should be chosen to optimize analog performance of phase interpolation stage 202. DAC(s) 224 can be regarded as at least one programmable current source each respectively connected to one of phase interpolation stage 202 or TIA stage 250 to adjust a respective one of a gain of phase interpolation stage 202 or a bandwidth of TIA stage 250.

Again, as indicated above, in applications in which additional amplification is needed or desired, multiple TIA stages can be used, where a device or arrangement can be included between TIA stages to convert the output of one TIA stage from a voltage signal to a current signal that is the input for the next TIA stage. For example, TIA stage 250 can be a first of at least two TIA stages arranged in series, with provision for converting the voltage output of the TIA stage to a current output, such as by including an interposed transconductance stage, a source coupled differential pair stage, or other suitable device or arrangement as would be evident to those skilled in the art. In some implementations, one or more current-to-voltage converters could take the form of additional phase interpolation stages 202 within the scope of embodiments.

Figure 3:
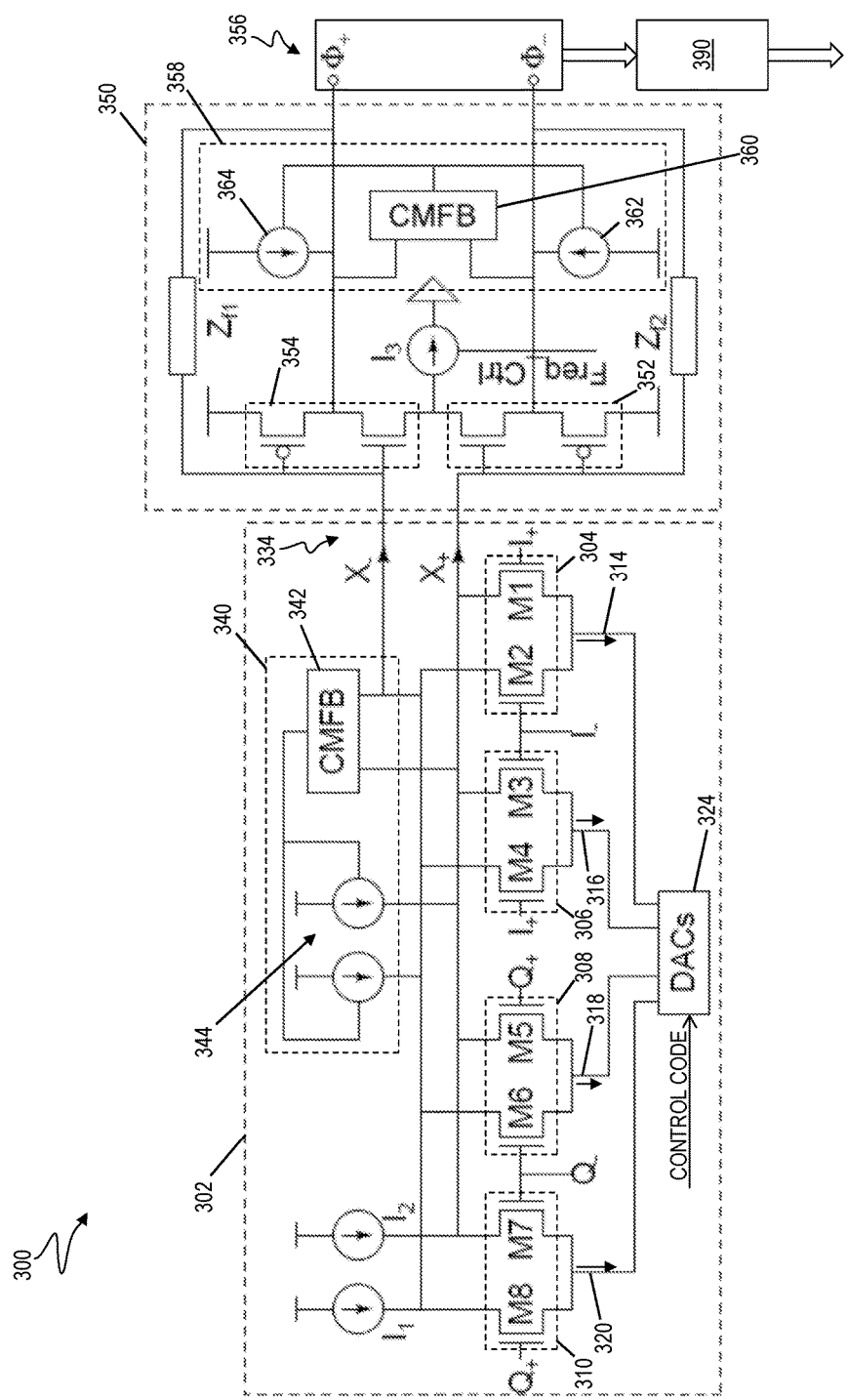
FIG. 3 is a schematic circuit diagram showing another example of a phase rotator apparatus implemented in accordance with embodiments disclosed herein.

Another non-limiting example of a phase rotator system or apparatus 300 according to embodiments is shown in FIG. 3 and includes a phase interpolation stage 302 that has four differential input devices 304, 306, 308, 310, here shown as differential pairs of transistors M1/M2, M3/M4, M5/M6, and M7/M8. The four differential pairs 304-310 can mix four phases of an input signal in combinations $I_+/I_-$, $Q_+/Q_-$, $I_-/I_+$, and $Q_-/Q_+$, where $Q_+$ is 90° or π radians out of phase of $I_+$. It should be recognized again that the example shown in FIG. 3 is non-limiting, and that any suitable number of phases with any suitable spacing could be employed, with suitable changes to the numbers of differential pairs used and connections therebetween, within the scope of embodiments. In the non-limiting example of FIG. 3, phase interpolation stage 302 can provide a differential output current $X_+/X_-$ proportional to a desired mixture of the input signals. Current source loads $I_1$, $I_2$ can be connected to negative part $X_-$ and positive part $X_+$, respectively. In embodiments, the first and second current-source loads can be programmable current sources to adjust a common mode of the phase interpolation stage.

As shown in FIG. 3, current-output DAC apparatus 324 can be used to produce tail currents 314, 316, 318, 320 for differential pairs 304-310, connected to the gates of the transistors, to set relative weights of the four input phases. As with the non-limiting example of FIG. 2, DAC apparatus 324 can include one or more DACs with various numbers of cells as may be suitable and/or desired, and in embodiments could include at least one DAC having polarity bits as part of control of currents 314, 316, 318, 320. See, for example, Rylov et al., incorporated by reference above. With suitable control code, current-output DAC apparatus 324 can selectively produce tail currents 314, 316, 318, 320 that position phase states of phase rotator apparatus output 334 on an octagonal envelope.

Continuing with reference to the non-limiting example shown in FIG. 3, differential output 334 of phase interpolation stage 302 can be received as a differential input by a transimpedance stage 350 that can convert the differential output current from phase interpolation stage 302 to a differential output voltage signal $\Phi_+/\Phi_-$. Feedback impedances of substantially equal value $Z_{f1}$ and $Z_{f2}$ set the gain and bandwidth of TIA stage 350, which here is a bandwidth of phase rotator apparatus 300. Voltage control apparatus 340, 358 can be employed including common-mode feedback (CMFB) circuits 342, 360 and current sources 344, 362, 364 to set the common-mode voltage at the outputs 334 and 356 of phase interpolation stage 302 and TIA stage 350, respectively.

More specifically, again referring to FIG. 3, a phase rotator apparatus 300 can include a four-quadrant phase interpolation stage 302 with a differential current-mode mixer that has four differential input devices 304, 306, 308, 310 connected in parallel and disposed to mix four phases $I_+$, $I_-$, $Q_+$, $Q_-$, of an incoming clock signal. In embodiments, the four phases can be equidistant, with $I_+$ representing a zero phase, $I_-$ representing a 180° or π radian phase, $Q_+$ representing a 90° or $$\frac{\pi}{2}$$

radian phase, and $Q_-$ representing a 270° or $$\frac{3\pi}{2}$$

radian phase. A differential output 334 of phase interpolation stage 302 can include a positive output part $X_+$ and a negative output part $X_-$, differential output 334 of phase interpolation stage 302 representing an initial adjusted clock signal. As in the example of FIG. 3, phase interpolation stage 302 can advantageously replace typical load resistances/impedances with a respective current-source load $I_1$, $I_2$ connected to each respective part $X_+$, $X_-$ of output 334 of phase interpolation stage 302.

In the example shown in FIG. 3, at least one current-output DAC apparatus 324 can include a plurality of current-output DACs, such as an I-DAC (not shown) connected to first and second differential input devices 304, 306 and a Q-DAC (not shown) connected to third and fourth differential input devices 308, 310. Such DAC arrangements are known, such as that of Rylov et al. incorporated by reference above. In embodiments, regardless of the particular arrangement and number of DACs in DAC(s) 324, DAC(s) 324 can selectively generate a pair of output currents 314/416 and 318/420 that can provide weight signals to differential input devices 304-310 as tail currents to gates of transistors of differential input devices 304-310. Thus, in embodiments, output currents 314, 316, 318, 320 of at least one current-output DAC(s) 324 can selectively produce mixer tail currents that can position phase states of phase rotator apparatus output signal 356 on an octagonal envelope. While this example positions phase states of output signal 356 on an octagonal envelope, positioning on other envelopes is within the scope of embodiments, and DAC arrangements to achieve such positioning are known and/or well within the knowledge of those skilled in the art.

A transimpedance amplifier (TIA) stage 350 can include a differential input connected to differential output 334 of phase interpolation stage 302 and can have a TIA stage output 356, and at least one output channel 390 can be connected to TIA stage output 356 for delivering the output from TIA stage 350 as an output of phase rotator apparatus 300 representing a phase-adjusted version of the incoming clock signal.

TIA stage 350 can include an amplifier connected to TIA stage differential input/phase interpolation stage output 334 and to TIA stage output 356, TIA stage 350 further including a first feedback impedance $Z_{f1}$ connected to a negative part $X_-$ of the TIA stage differential input and to a positive part $\Phi_+$ of TIA stage output 356, and a second feedback impedance $Z_{f2}$ connected to a positive part $X_+$ of the TIA stage differential input and to a negative part $\Phi_-$ of TIA stage output 356.

A voltage control apparatus 340 can be included in phase interpolation stage 302. Voltage control apparatus 340 can include a common-mode feedback (CMFB) circuit 342 that can be connected to each respective part $X_+$, $X_-$ of differential output 334 of phase interpolation stage 302. CMFB circuit 342 in combination with injection currents 344 can maintain a voltage of phase interpolation stage differential output 334 at a desired level, which can in embodiments include a pre-defined level. As with the example of FIG. 2, it should be recognized by those skilled in the art that the particular pre-defined level for the common mode voltage can vary widely and should be chosen to optimize analog performance of the phase interpolation stage 302. Additionally, while first and second current source loads $I_1$, $I_2$ are not shown as variable, this relies on the use of a CMFB control system with wide enough range that they need not be varied. However, in implementations where such a range is not desirable or practical in a CMFB control system, one or both of first and second current source loads $I_1$, $I_2$ can be variable.

A voltage control apparatus 358 can be included in TIA stage 350, including a CMFB circuit 360 and injector currents 362, 364 connected to outputs of differential input devices 352, 354 of TIA stage 350 and to output 356 of TIA stage 350. In embodiments, at least one programmable current source can be provided in electrical communication with TIA stage 350 to adjust a bandwidth of TIA stage 350, and CMFB circuit 360 can automatically adjust current source(s) 362, 364 until the output common mode is equal to a common mode reference voltage. For example, when tail current $I_3$ is increased, voltage at drains of input transistors 356 decreases, and CMFB circuit 360 can increase currents 344 to bring voltage (output common mode) back up. Similarly, if tail current $I_3$ is decreased by some value, the same output common mode can be maintained if currents 344 through current sources 362, 364 is decreased, such as by ½ of the reduction in tail current $I_3$ each. The CMFB can do this automatically without needing to incorporate digital frequency scaling control signals/switches. Thus, because there is CMFB, the complexity of the frequency scaling circuitry is reduced. In embodiments, TIA stage 350 can include active pull-up input driving devices and active pull-down input driving devices, such as transistors of differential input devices 352, 354, though where CMFB is used in both phase interpolation stage 302 and TIA stage 350, CMFB circuits can work in conjunction with frequency scaled tail current(s), such as currents 314-320, so that frequency-dependent programmability in pull-up current sources may not be necessary.

As in the example shown in FIG. 2, a phase rotator apparatus 300 as shown in FIG. 3 used in applications in which additional amplification is needed or desired can include multiple TIA stages 350. In such implementations, a device or arrangement can be included between TIA stages to convert the output of one TIA stage from a voltage signal to a current signal that is the input for the next TIA stage. For example, TIA stage 350 can be a first of at least two TIA stages arranged in series, with provision for converting the voltage output of the TIA stage to a current output, such as by including an interposed transconductance stage, a source coupled differential pair stage, or any other suitable device or arrangement as would be evident to those skilled in the art. In some implementations, one or more current-to-voltage converters could take the form of additional phase interpolation stages 302 within the scope of embodiments.

Figure 4:
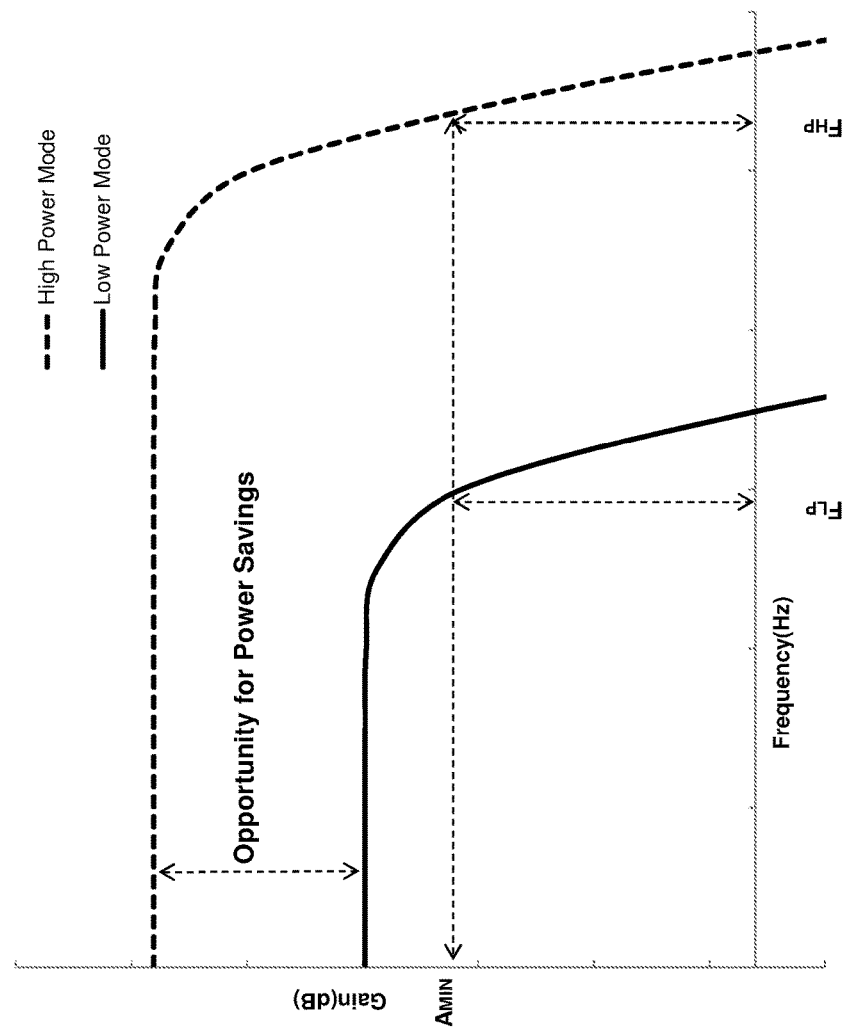
FIG. 4 shows a graph of Gain vs. Frequency to illustrate some benefits of a phase apparatus according to embodiments disclosed herein.

FIG. 4 shows a graph of Gain vs. Frequency to illustrate some benefits of using a phase interpolation stage and a TIA stage according to embodiments, particularly where adjustable currents are provided to differential pairs of each stage, such as currents 314-320 and $I_3$ of FIG. 3. More particularly, the product of gain and bandwidth can be manipulated to shift frequency response in a low power mode, which can reduce power consumption while maintaining signal strength at sufficient levels, such as above. In the graph, Amin represents a minimum required gain for the system to operate. Lowering currents, such as lowering $I_3$, lowers gain and bandwidth, and conversely lowering required bandwidth of embodiments results in needing lower currents, so lowering required bandwidth reduces power consumption.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially square" may refer to a shape having four major sides, but with some variation in the shape of the sides, or the number of additional minor sides provided.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A phase rotator system comprising:
   a phase interpolation stage including at least two gain ($G_m$) stages connected in parallel to a differential output of the phase interpolation stage, each gain stage receiving as input a respective pair of phases of an incoming clock signal;
   a first current-source load connected to a negative part of the differential output of the phase interpolation stage;
   a second current-source load connected to a positive part of the differential output of the phase interpolation stage;
   a current-output digital-to-analog converter (DAC) apparatus supplying at least one tail current to each gain stage, each current acting as a weight on the respective pair of phases;
   a transimpedance amplifier (TIA) stage having a differential TIA stage input connected to the differential output of the phase interpolation stage and a TIA stage output; and
   a channel connected to the TIA stage output and selectively delivering the TIA stage output as an output of the phase rotator system representing a phase-adjusted version of the incoming clock signal.

2. The phase rotator system of claim 1, wherein each gain stage includes at least a pair of differential input transistors and a common mode feedback circuit connected to outputs of the differential input transistors and to the differential output of the phase interpolation stage, thereby maintaining a common mode of the phase interpolation stage differential output at a pre-defined level.

3. The phase rotator system of claim 1, wherein the TIA stage includes at least a pair of differential input transistors and a common mode feedback circuit connected to outputs of the differential input transistors and to the TIA stage output, thereby maintaining a common mode of the TIA stage output at a desired level.

4. The phase rotator system of claim 1, further comprising at least one programmable current source each respectively connected to one of the phase interpolation stage or the TIA stage to adjust a respective one of a gain of the phase interpolation stage or a bandwidth of the TIA stage.

5. A phase rotator apparatus comprising:
   a four-quadrant phase interpolation stage including a differential current-mode mixer having at least four differential input devices connected in parallel and disposed to mix respective equidistant phases of an incoming clock signal and a differential output of the phase interpolation stage including a positive output part and a negative output part, the differential output of the phase interpolation stage representing an initial adjusted clock signal;
   a respective current-source load connected to each respective part of the output of the phase interpolation stage;
   a plurality of current-output digital-to-analog converters selectively generating at least two pairs of output currents that provide weight signals to the differential input devices as tail currents of the differential input devices;
   at least two transimpedance amplifier (TIA) stages arranged in series with a respective voltage-to-current converter interposed therebetween to convert a preceding TIA stage output from a voltage signal to a current signal that is an input for a next TIA stage, the first TIA stage of the at least two TIA stages including a differential input connected to the differential output of the phase interpolation stage, and the final TIA stage of the at least two TIA stages having a TIA series output; and
   at least one output channel connected to the TIA series output for delivering the output from the TIA stage as an output of the phase rotator apparatus representing a phase-adjusted version of the incoming clock signal.

6. The apparatus of claim 5, wherein the TIA stage includes an amplifier connected to TIA stage differential input and to the TIA stage output, the TIA stage further including a first impedance-like load connected to a positive part of the TIA stage differential input and to a negative part of the TIA stage output, and a second impedance-like load connected to a negative part of the TIA stage differential input and to a positive part of the TIA stage output.

7. The apparatus of claim 5, further comprising a common-mode feedback circuit connected to each respective part of the differential output of the phase interpolation stage, thereby maintaining a common-mode voltage of the phase interpolation stage differential output at a desired level.

8. The apparatus of claim 5, further comprising a common-mode feedback circuit connected to the output of the TIA stage.

9. The apparatus of claim 5, further comprising at least one programmable current source in electrical communication with the TIA stage to adjust a bandwidth of the TIA stage.

10. The apparatus of claim 5, wherein at least one of the first and second current-source loads is a programmable current source to adjust a common mode of the phase interpolation stage.

11. The apparatus of claim 5, wherein the TIA stage includes active pull-up input driving devices and active pull-down input driving devices.

12. A phase rotator apparatus comprising:
    at least two sets of differential voltage inputs each having a positive part and a negative part;
    a phase interpolation stage receiving the two sets of differential voltage inputs and having a differential output with a positive part and a negative part, and the phase interpolation stage further having a differential current-mode mixer including:
      at least two pairs of differential input transistors, each transistor having a respective source, gate, and drain, each pair of the at least two pairs of differential input transistors having a respective input in electrical communication with one of the two sets of differential voltage inputs, wherein one pair of the at least two pairs of differential input transistors is associated with a minimum phase of the phase rotator and another pair of the at least two pairs of differential input transistors is associated with a different phase of the phase rotator, and wherein the drains of the differential input transistors associated with the respective positive part of each differential voltage input are connected to each other and to the positive part of the differential output of the phase interpolation stage, and wherein the drains of the differential input transistors associated with the respective negative part of each differential voltage input are connected to each other and to the negative part of the differential output of the phase interpolation stage;

a first current-source load connected to the negative part of the differential output of the current-mode mixer;

a second current-source load connected to the positive part of the differential output of the current-mode mixer;

a current-output digital-to-analog converter apparatus in electrical communication with the sources of the differential input transistors selectively generating output currents, thereby providing weight signals as tail currents to the at least two pairs of differential input transistors;

a transimpedance amplifier (TIA) stage connected to and receiving as input the differential output of the phase interpolation stage and having a TIA stage output; and at least one output channel in electrical communication with the TIA stage output for delivering the output from the TIA stage as an output of the phase rotator apparatus.

13. The apparatus of claim 12, wherein the TIA stage is fully differential and includes a TIA stage amplifier having at least one pair of differential input transistors, each transistor having a respective source, gate, and drain, each pair of the at least one pair of differential input transistors having a respective input in electrical communication with a respective TIA stage input.

14. The apparatus of claim 13, further comprising a common-mode feedback circuit connected to the TIA stage output, thereby maintaining a common-mode voltage of the TIA stage at a desired level.

15. The apparatus of claim 12, further comprising a common-mode feedback circuit connected to the differential output of the current-mode mixer, thereby maintaining a common-mode voltage of the differential output of the phase interpolation stage at a desired level.

16. The apparatus of claim 12, wherein the TIA stage is a first of at least two TIA stages arranged in series with a respective voltage-to-current converter interposed therebetween to convert a preceding TIA stage output from a voltage signal to a current signal that is an input for a next TIA stage.

17. The apparatus of claim 12, further comprising a TIA stage amplifier in the TIA stage, and at least one programmable current source in electrical communication with the TIA stage amplifier to adjust a bandwidth of the TIA stage.

18. The apparatus of claim 12, wherein at least one of the first and second current-source loads is a programmable current source to adjust a common mode of the phase interpolation stage.

19. The apparatus of claim 12, wherein the TIA stage includes at least one active pull-up input driving device and at least one active pull-down input driving device.

20. The phase rotator system of claim 1, wherein the first current-source load and the second current-source load are each variable.

* * * * *